United States Patent
Hasegawa et al.

(10) Patent No.: US 6,215,370 B1
(45) Date of Patent: Apr. 10, 2001

(54) CRYSTAL OSCILLATOR CIRCUIT WITH CRYSTAL REDUCING RESISTANCE AND INTEGRATED CIRCUIT THEREFOR

(75) Inventors: Eiichi Hasegawa; Haruhiko Otsuka, both of Tokyo (JP)

(73) Assignee: Nippon Precision Circuits Inc., Tokyo (JP); .

( * ) Notice: Subject to any disclaimer, the term of this patent is extended or adjusted under 35 U.S.C. 154(b) by 0 days.

(21) Appl. No.: 09/004,686

(22) Filed: Jan. 8, 1998

(30) Foreign Application Priority Data

Jan. 16, 1997 (JP) .................................................. 9-005765

(51) Int. Cl.[7] .............................. H03B 5/32; H03B 5/36
(52) U.S. Cl. ..................................... 331/158; 337/116 FE
(58) Field of Search .......................... 331/116 R, 116 FE, 331/117 R, 117 FE, 117 D, 158, 160

(56) References Cited

U.S. PATENT DOCUMENTS

| 3,803,828 | * | 4/1974 | Keeler et al. ................ | 58/23 AC |
| 3,939,642 | * | 2/1976 | Morozumi ..................... | 58/23 A |
| 3,958,187 | * | 5/1976 | Suzuki et al. ................ | 331/74 |
| 5,457,433 | * | 10/1995 | Westwick ..................... | 331/116 FE |

FOREIGN PATENT DOCUMENTS

| 57-26903 | | 2/1982 | (JP) . | |
| 0079603 | * | 3/1990 | (JP) ............................... | 331/116 FE |
| 5-191144 | | 7/1993 | (JP) . | |

OTHER PUBLICATIONS

Uno, T. et al; "A New Digital TCXO Circuit Using a Capicitor–Switch Array"; *Proc. 37th Annual Frequency Control Symposium*; 1983 pp. 434–441.*

* cited by examiner

Primary Examiner—David Mis
(74) Attorney, Agent, or Firm—Jordan and Hamburg LLP

(57) ABSTRACT

A crystal oscillator circuit includes a CMOS invertor having an input terminal and an output terminal, a crystal resonator connected between the input terminal and the output terminal respectively at a first connection node and a second connection node, and a feedback resistor connected between the input terminal and the output terminal of the CMOS invertor. A first capacitor is provided between the first connection node and a power source terminal at a predetermined potential and a second capacitor is provided between the second connection node and a power source terminal at the predetermined potential. At least one resistor is disposed in series with at least one of the first capacitor and the second capacitor and has a resistance so as to limit a crystal current in the crystal resonator while maintaining negative resistance for stable oscillation. In an embodiment, a resistor is provided in series with each capacitor. Furthermore, an embodiment of the invention includes an integrated circuit permitting the above circuit structure with the crystal resonator and first and second capacitors accommodated external of the integrated circuit. Alternatively, the first and second capacitors may be accommodated on the integrated circuit.

22 Claims, 14 Drawing Sheets

CRYSTAL OSCILLATOR CIRCUIT WITH CRYSTAL REDUCING RESISTANCE AND INTEGRATED CIRCUIT THEREFOR

BACKGROUND OF THE INVENTION

1. Field of the Invention

The present invention relates to a crystal oscillating circuit and an integrated circuit for crystal oscillation.

2. Description of the Related Art

FIG. 16 is an electric circuit diagram showing a conventional oscillating circuit using a crystal resonator. Numeral 161 designates a crystal resonator, numeral 162 designates a CMOS (Complementary Metal Oxide Semiconductor) invertor, numeral 163 designates a feedback resistor and numerals 164 and 165 designate capacitors. The crystal resonator 161 and the feedback resistor 163 are connected between input and output terminals of the CMOS invertor 162. Terminals on one side of the capacitors 164 and 165 are respectively connected to the input terminal and the output terminal of the CMOS invertor and terminals on the other side thereof are connected to a power source VSS (OV).

At present, according to such an oscillating circuit, downsizing of the crystal resonator has progressed in response to a need for speed-up of operational frequency and downsizing a total of a crystal oscillation module.

However, with downsizing a crystal resonator, a problem caused by crystal current (current flowing in a crystal in oscillation) cannot be neglected. For example, an increase in an amplitude by an excessive crystal current makes frequency unstable and brings about destruction of a crystal resonator in the worst case.

Further, although there has been proposed a circuit where the crystal current is reduced by providing a resistor 166 between the CMOS invertor 162 and the crystal resonator 161 as shown by FIG. 17, a resistance value thereof cannot be increased since the resistance value effects a significant influence on the negative resistance. Further, according to such a circuit, not only the crystal current but the amplitude voltage are lowered. Therefore, setting of the circuit becomes difficult in which the duty of a CMOS invertor at a next stage is significantly changed in view of a threshold voltage of the CMOS invertor at the next stage and the like.

SUMMARY OF THE INVENTION

Hence, according to the present invention, the crystal current is reduced by providing resistors not on paths formed by the input terminal and the output terminal of the CMOS invertor and the crystal resonator, but either of paths formed by the input terminal of the CMOS invertor, a first capacitance element and a power source terminal and/or either of paths formed by the output terminal of the CMOS invertor, a second capacitance element and a power source terminal.

According to an aspect of the present invention, there is provided a crystal oscillating circuit constituted by a CMOS invertor, a crystal resonator connected between input and output terminals of the CMOS invertor, a feedback resistor connected between the input terminal and the output terminal of the CMOS invertor, a first capacitance element provided between a first connection point of connecting the input terminal of the CMOS invertor and the crystal resonator and a power source terminal at a predetermined potential, a second capacitance element provided between a second connection point of connecting the output terminal of the CMOS invertor and the crystal resonator and a power source terminal at the predetermined potential, and resistors provided at either of one or a plurality of portions between the first connection point and the first capacitance element, between the second connection point and the second capacitance element, between the first capacitance element and the power source terminal and between the second capacitance element and the power source terminal. And it is desirable to provide an integrated circuit for crystal oscillation capable of constituting such a crystal oscillating circuit.

Further, it is preferable that the resistors are provided between the first connection point and the first capacitance element and between the second connection point and the second capacitance element, respectively.

It is preferable that the resistors are provided between the first capacitance element and the power source terminal and between the second capacitance element and the power source terminal, respectively.

It is preferable that the resistors are provided between the first capacitance element and the power source terminal and between the second connection point and the second capacitance element, respectively.

It is preferable that the resistors are provided between the first connection point and the first capacitance element and between the second capacitance element and the power source terminal, respectively.

DETAILED DESCRIPTION OF THE PREFERRED EMBODIMENTS

Figure 1:
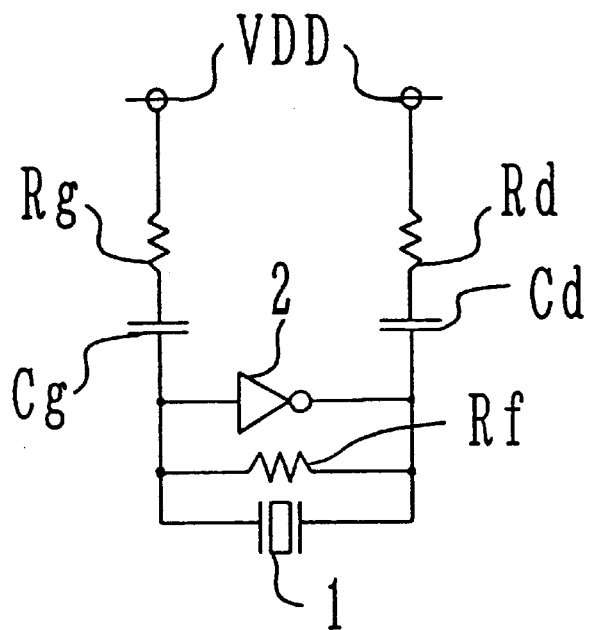
FIG. 1 is an electric circuit diagram showing the constitution of a crystal oscillating circuit according to an embodiment of the present invention.

Next, an explanation will be given of a crystal oscillating circuit according to an embodiment of the present invention. FIG. 1 is an electric circuit diagram showing the constitution of the embodiment. In FIG. 1, numeral 1 designates a crystal resonator, numeral 2 designates a CMOS invertor and the crystal resonator 1 is connected between input and output terminals of the CMOS invertor 2 wherein the crystal resonator is externally attached to an integrated circuit (not illustrated) integrating the CMOS invertor 2. Notation Rf designates a feedback resistor which is connected between the input terminal and the output terminal of the CMOS invertor 2. Notations Cg and Cd designate capacitors. The capacitors Cg and Cd are respectively connected to the input terminal and the output terminal of the CMOS invertor 2. Notations Rg and Rd designate resistors in which the resistor Rg is connected between the capacitor element Cg and a power source terminal VDD (5.0 V) and the resistor Rd is connected between the capacitor element Cd and the power source terminal VDD (5.0 V). In this case, the CMOS invertor 2 includes an Mo (Molybdenum) gate, the capacitance and the resistance of which are smaller than those of a Poly-Si (polysilicon) gate and the CMOS invertor 2 can be regarded to connect with only pure capacitance elements and the pure resistance elements consisting of the capacitors Cg and Cd and the resistors Rg and Rd, respectively.

Next, the characteristics of the crystal oscillating circuit of the embodiment will be described.

Figure 2:
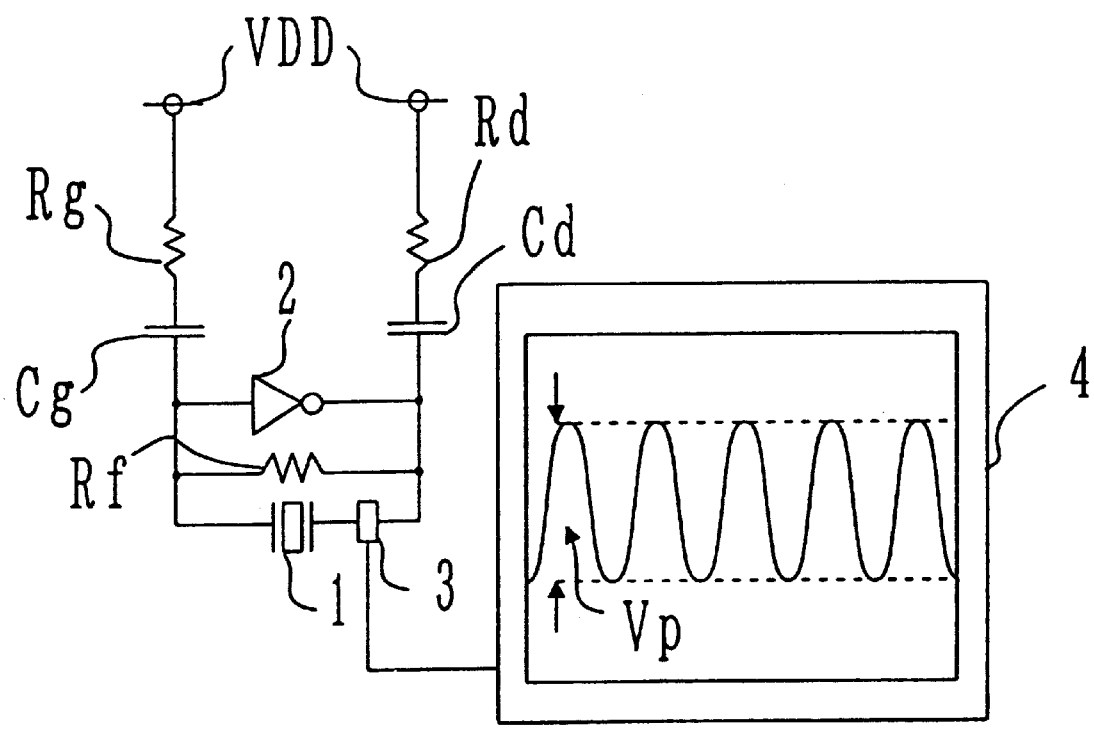
FIG. 2 is a schematic showing a constitution for measuring crystal current in the crystal oscillating circuit of FIG. 1.

The following relationship will be shown by measuring a crystal current Ix flowing in the crystal resonator 1 by using a current probe 3 and a digital oscillograph 4 as shown by FIG. 2. The crystal current Ix can be represented by $Ix=Vp/(2\sqrt{2})$ by using an amplitude value Vp (V) of a current waveform on the digital oscillograph and in this case, the characteristics will be described by showing Vp for convenience in place of the crystal current Ix. Further, although the amplitude value Vp is a voltage value, this is a value produced by converting a current value into the voltage value which is different from an actual amplitude voltage of the crystal resonator 1.

Figure 3:
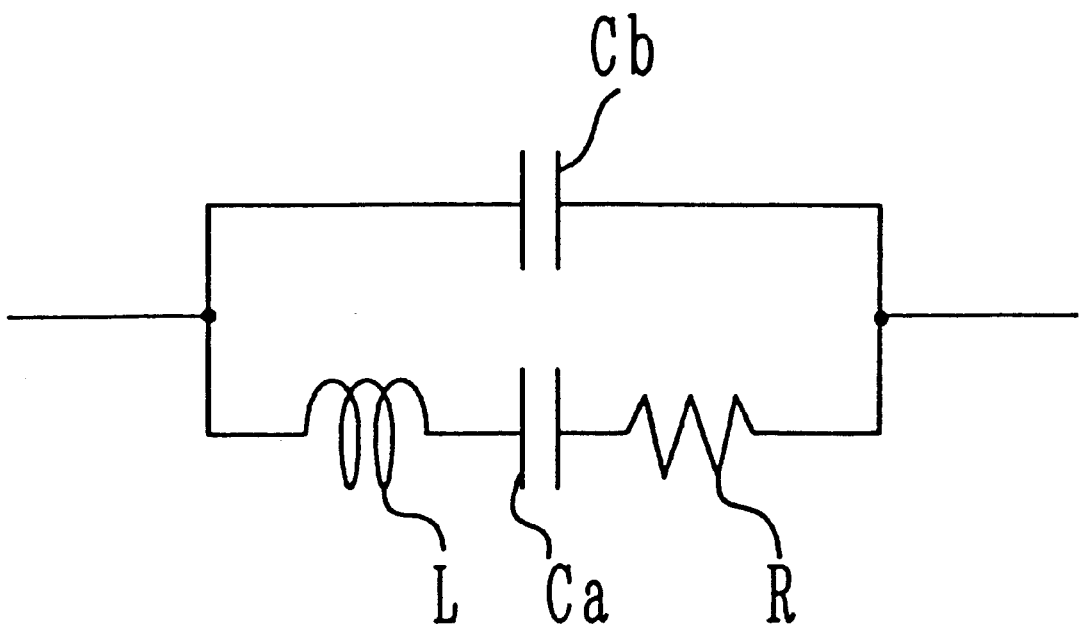
FIG. 3 is an equivalent circuit diagram of a crystal resonator used in the crystal oscillating circuit of FIG. 1.

The crystal resonators 1 used in an experiment are provided with fundamental frequencies of 70 MHz and 100 MHz and both of the crystal resonators 1 can be represented by an equivalent circuit of FIG. 3. In FIG. 3, in the case of the crystal resonator 1 having the fundamental frequency of 70 MHz, a capacitance value of a capacitor Ca is about 2.07861 fF, a capacitance value of a capacitor Cb is about 6.37687 pF, a resistance value of a resistor R is about 13.9976Ω and an inductance value of an inductor L is 2.48692 mH.

Further, in the case of the crystal resonator 1 having the fundamental frequency of 100 MHz, the capacitance value of the capacitor Ca is about 691.688 aF, the capacitance value of the capacitor Cb is about 5,00331 pF, the resistance value of the resistor R is about 20.8419Ω and the inductance value of the inductor L is 3,66203 mH. Further, the feedback resistor Rf is provided with a resistance value of 3.9 KΩ.

Figure 4:
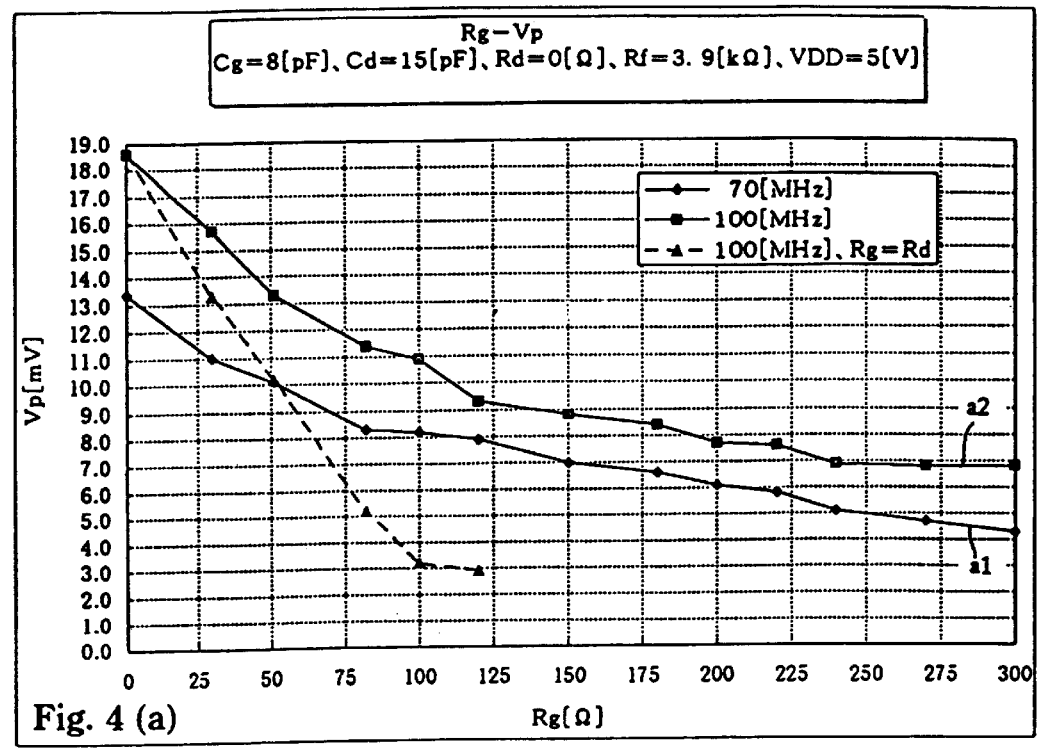
FIGS. 4(a) and 4(b) are graphs showing the characteristics of the crystal oscillating circuit of FIG. 1.
Figure 4:
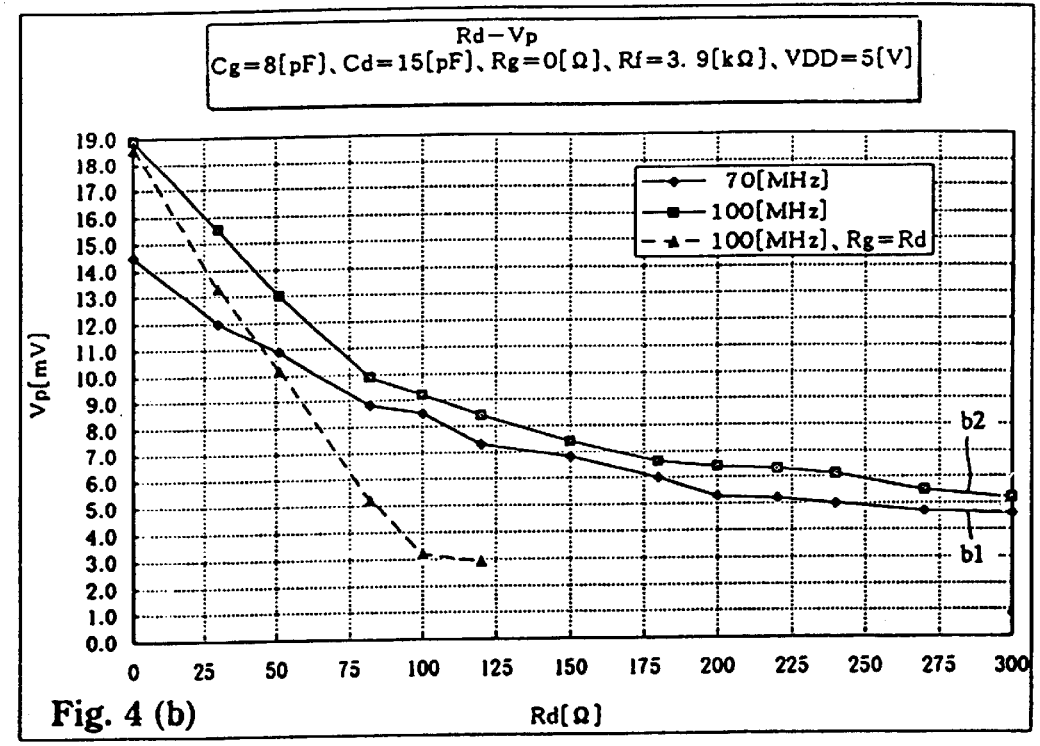

When capacitance values of the capacitors Cg and Cd are respectively set to 8 pF and 15 pF and a resistance value of the resistor Rd is set to 0 KΩ and Vp is measured while varying a resistance value of the resistor Rg, the characteristics are as shown by FIG. 4(a). In FIG. 4(a), a line a1 indicates a relationship of Rg–Vp in the case of using the crystal resonator 1 for 70 MHz and a line a2 indicates a relationship of Rg–Vp in the case of using the crystal resonator 1 for 100 MHz.

Similarly, when the resistance value of the resistor Rg is set to 0 KΩ and Vp is measured while varying the resistance value of the resistor Rd, the characteristics are as shown by FIG. 4(b) in which a line b1 indicates a relationship of Rg–Vp in the case of using the crystal resonator 1 for 70 MHz and a line b2 indicates a relationship of Rg–Vp in the case of using the crystal resonator 1 for 100 MHz.

In FIGS. 4(a) and 4(b), broken lines indicate relationships of Rg (Rd)–Vp in the case of oscillating the crystal resonators 1 at 100 MHz where the resistance values of the resistors Rg and Rd are equalized.

Further, relationships among the capacitance values of the capacitors Cd and Cg and Vp are as follows. In this case, when the resistance value of the resistor Rd is set to 0 KΩ and an investigation is performed on relationships of Cd (Cg)–Vp while equalizing the capacitance values of the capacitors Cg and Cd with respect to the resistance values of the resistor Rg of 0Ω51Ωand 100Ω, respectively, the relationships are as shown by lines c1, c2 and c3 of FIG. 5(a). When the resistance value of the resistor Rg is set to 0Ω and an investigation is performed on a relationship of Cg–Vp by fixing a capacitance value of the capacitor Cd to 22 pF, the relationship is as shown by a broken line c4 and when an investigation is performed on a relationship of Cd–Vp while fixing the capacitance value of the capacitor Cg to 22 pF, the relationship is as shown by a broken line c5.

Similarly, relationships among the capacitance values of capacitors Cd and Cg and the negative resistance are as follows. In this case, when the resistance value of the resistor Rd is set to 0 KΩ and an investigation is performed on relationships of Cd(Cg)—negative resistance while equalizing the capacitance values of the capacitors Cg and Cd with respect to the value of the resistor Rg of 0Ω, 51Ω and 100Ω, respectively, the relationships are as shown by lines d1, d2 and d3 of FIG. 5(b). When the value of the resistor Rg is set to 0Ω and an investigation is performed on a relationship of Cg—negative resistance by fixing the capacitance value of the capacitor Cd to 22 pF, the relationship is as shown by a broken line d4 and when an investigation is performed on a relationship of Cd—negative resistance while fixing the value of the capacitor element Cg to 22 pF, the relationship is as shown by a broken line d5.

Figure 6:
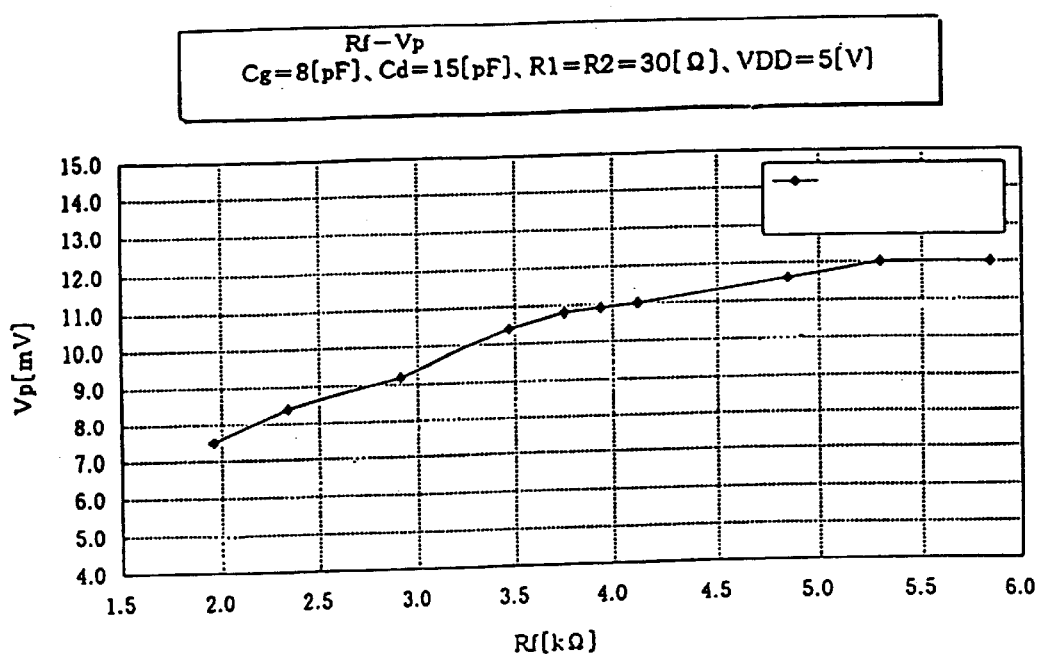
FIG. 6 is a graph showing the characteristics of the crystal oscillating circuit of FIG. 1.

Further, a relationship between the resistance value of the feedback resistor Rf and Vp is as shown by FIG. 6 when the capacitance values of the capacitors Cg and Cd are set to 8 pF and 15 pF, respectively, the resistance values of resistors Rd and Rg are set to 30Ω and the crystal resonator 1 for 70 MHz is used.

Figure 5:
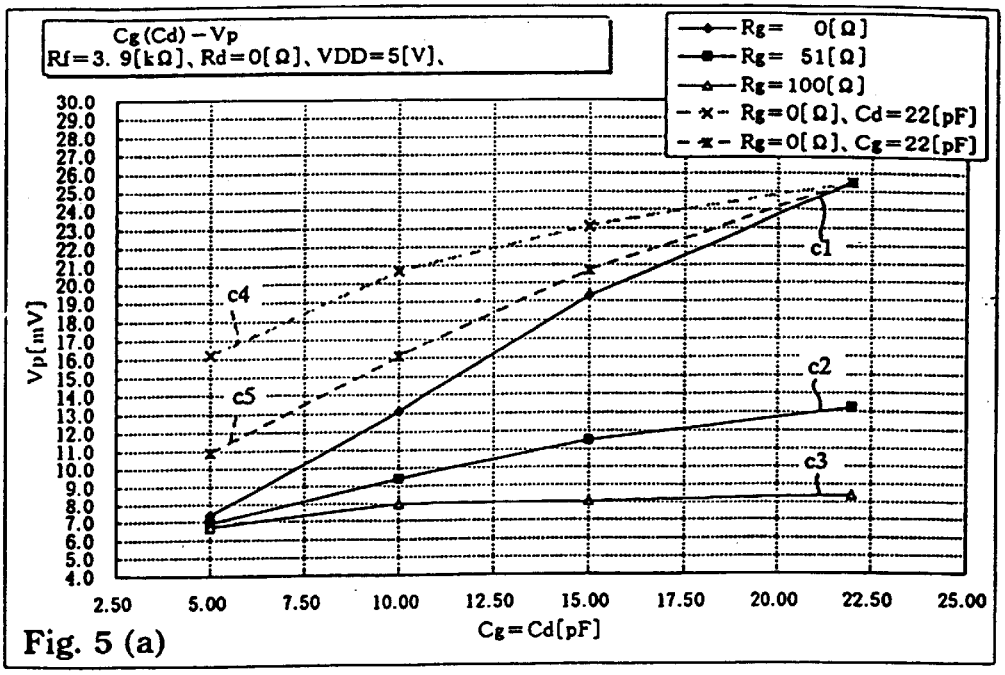
FIGS. 5(a) and 5(b) are graphs showing the characteristics of the crystal oscillating circuit of FIG. 1.
Figure 5:
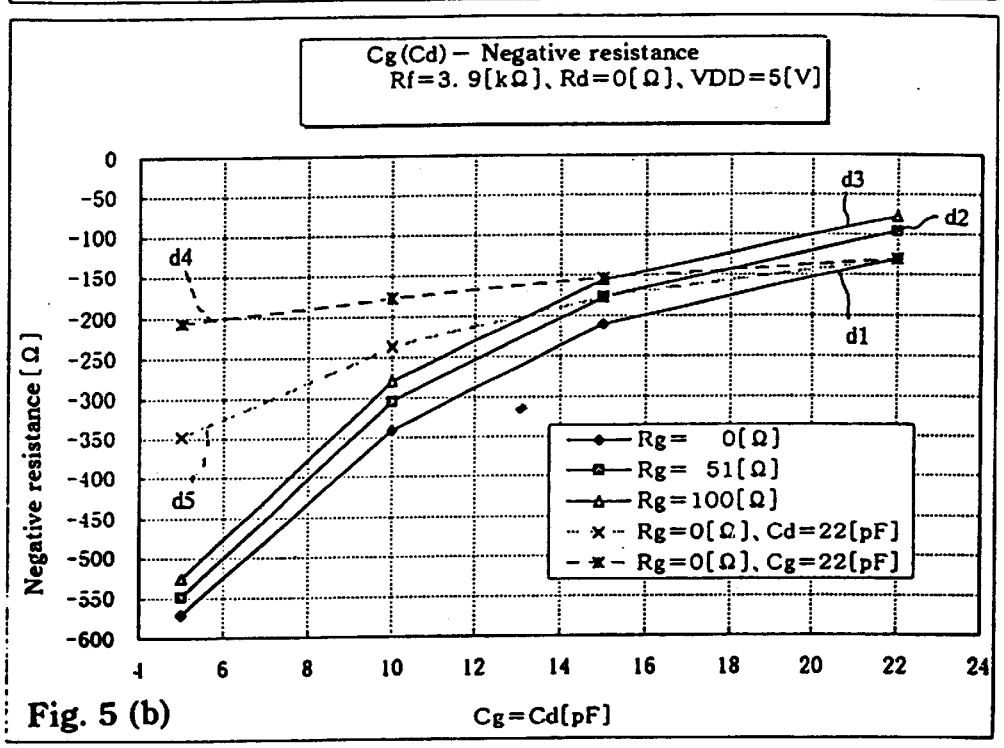

As described above, according to the crystal resonator circuit of the embodiment, as shown by FIGS. 4(a) and 4(b), when the resistance values of the resistors Rg and Rd are increased, the value of Vp, that is, the value of the crystal current can be reduced. Further, as shown by FIG. 5(a), the smaller the capacitance values of the capacitors Cd and Cg, the smaller the value of the crystal current can be made. Further, when the values of the resistors Rg and Rd are increased, the negative resistance is reduced as shown by FIG. 5(b), of which an influence is insignificant. Therefore, the negative resistance can be made larger than that in the conventional method, where a resistor is provided between an output terminal of a CMOS invertor and a crystal resonator, so that starting performance and stability of oscillation are promoted. Further, according to the circuit used in this experiment, an optimum value of the negative resistance falls in a range of 100Ω through 200Ω. The smaller the capacitance values of the capacitors Cd and Cg, the larger the negative resistance. Further, in respect of the effects of the capacitance values of the capacitors Cd and Cg, the effect by the capacitor Cg is stronger and the negative resistance can be increased by reducing the capacitance value of the capacitor Cg m comparison with the value of capacitor Cd.

In view of the above-described result, in order to balance the incapability of reducing the negative resistance more than it being needed in consideration of easiness in oscillation with the restriction of the crystal current, it is preferable that the capacitance values of the capacitors Cg and Cd are set to 8 pF through 15 pF and 10 pF through 20 pF, respectively and when the resistance values of the two resistors Rg and Rd are equalized, the resistance values of these are preferably about 20Ω through 100Ω and when one of the resistors Rg and Rd is provided, the resistance value is preferably about 20Ω through 200Ω.

Further, according to the embodiment, a resistor is not provided between the crystal resonator 1 and the CMOS invertor 2 as in the conventional example and therefore, only the crystal current can be reduced with the amplitude voltage remaining as it is.

Figure 7:
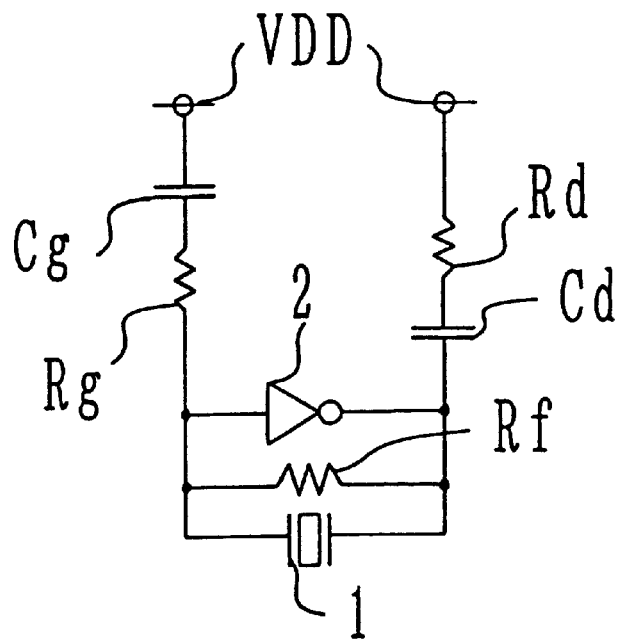
FIG. 7 is an electric circuit diagram showing the constitution of another crystal oscillating circuit according to the present invention.
Figure 8:
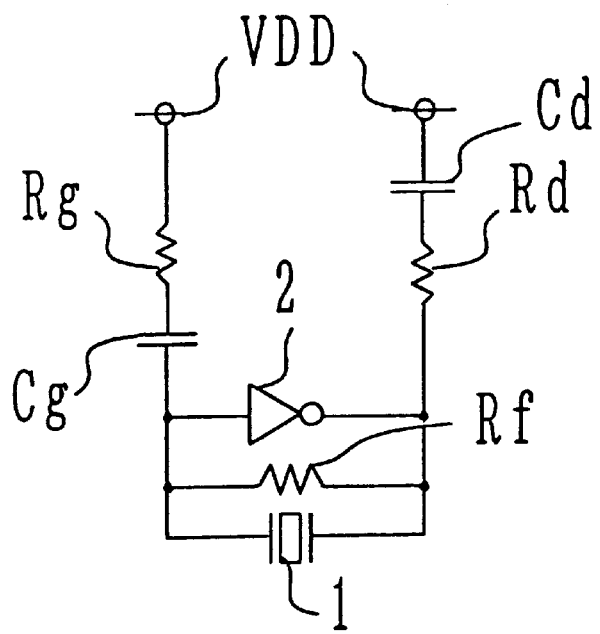
FIG. 8 is an electric circuit diagram showing the constitution of another crystal oscillating circuit according to the present invention.
Figure 9:
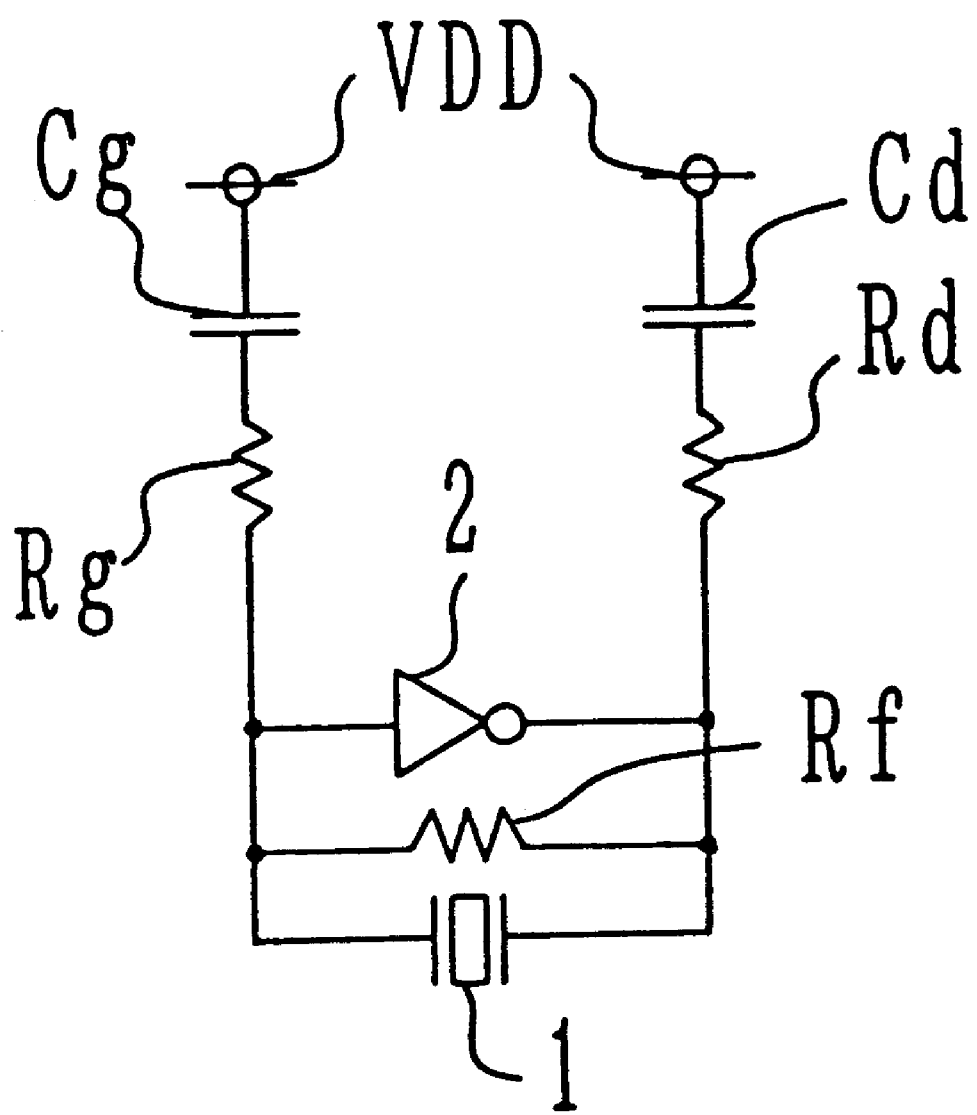
FIG. 9 is an electric circuit diagram showing the constitution of another crystal oscillating circuit according to the present invention.
Figure 10:
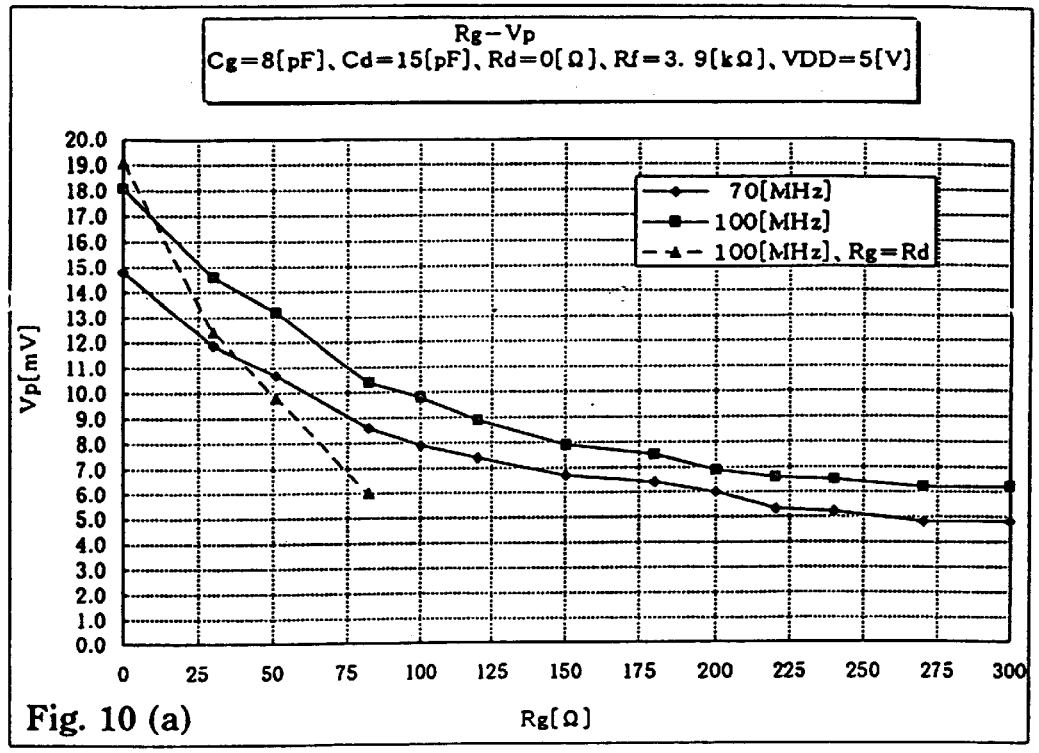
FIGS. 10(a) and 10(b) are graphs showing the characteristics of the crystal oscillating circuit of FIG. 7.
Figure 10:
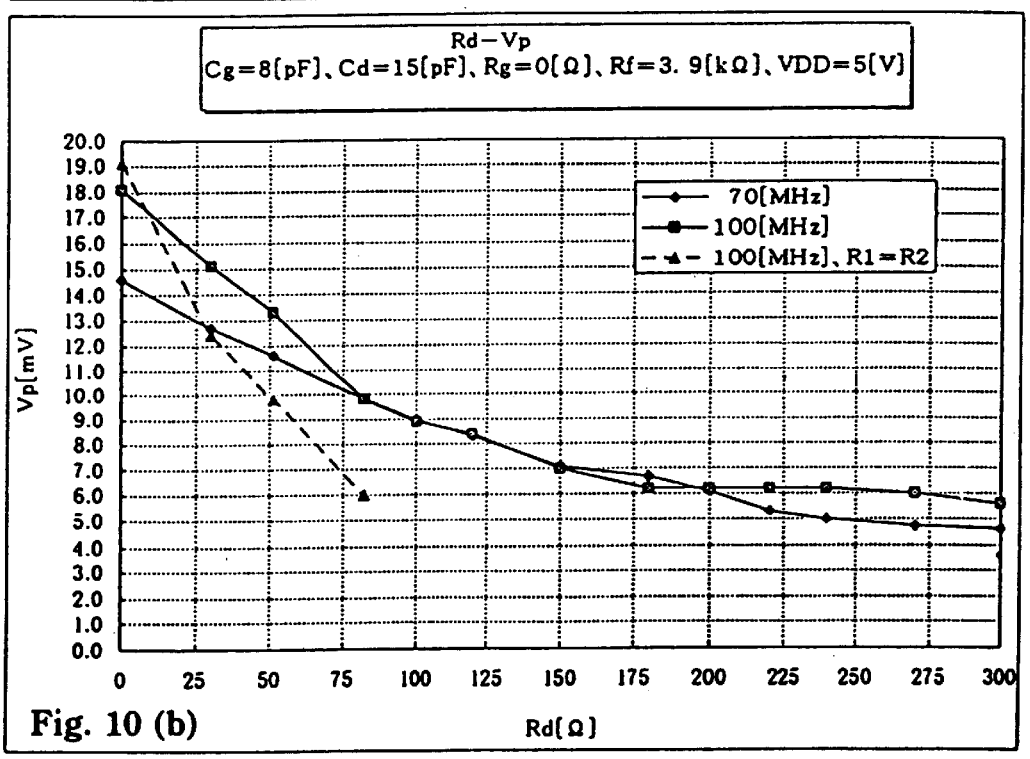
Figure 11:
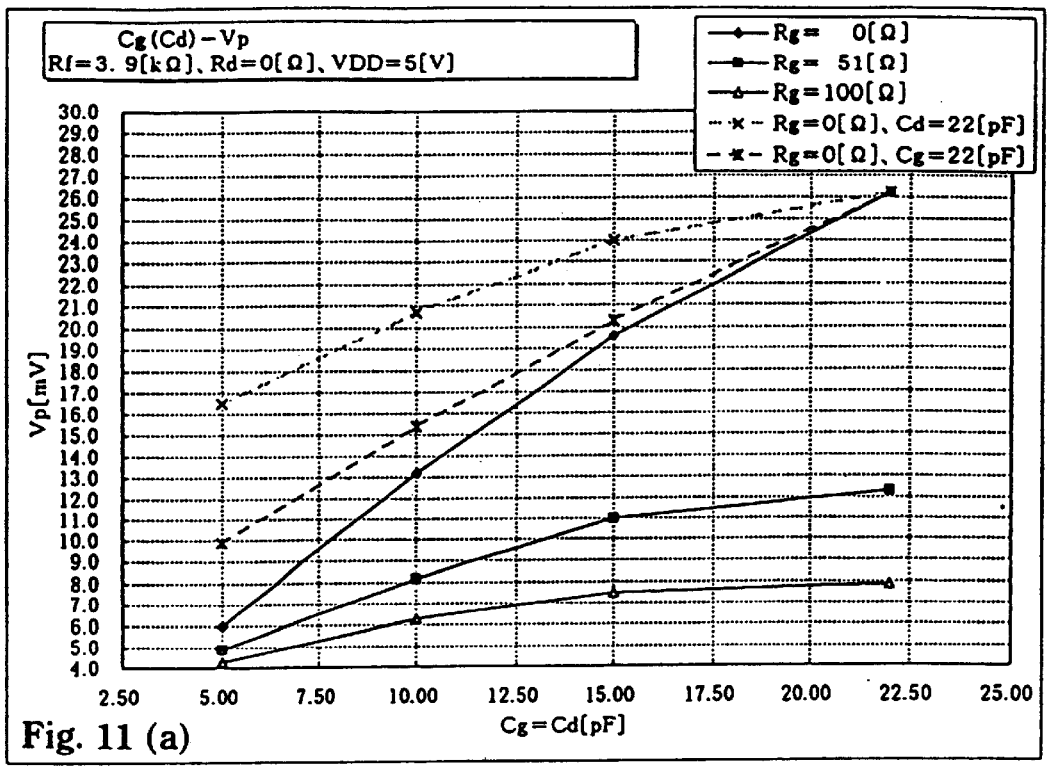
FIGS. 11(a) and 11(b) are graphs showing the characteristics of the crystal oscillating circuit of FIG. 7.
Figure 11:
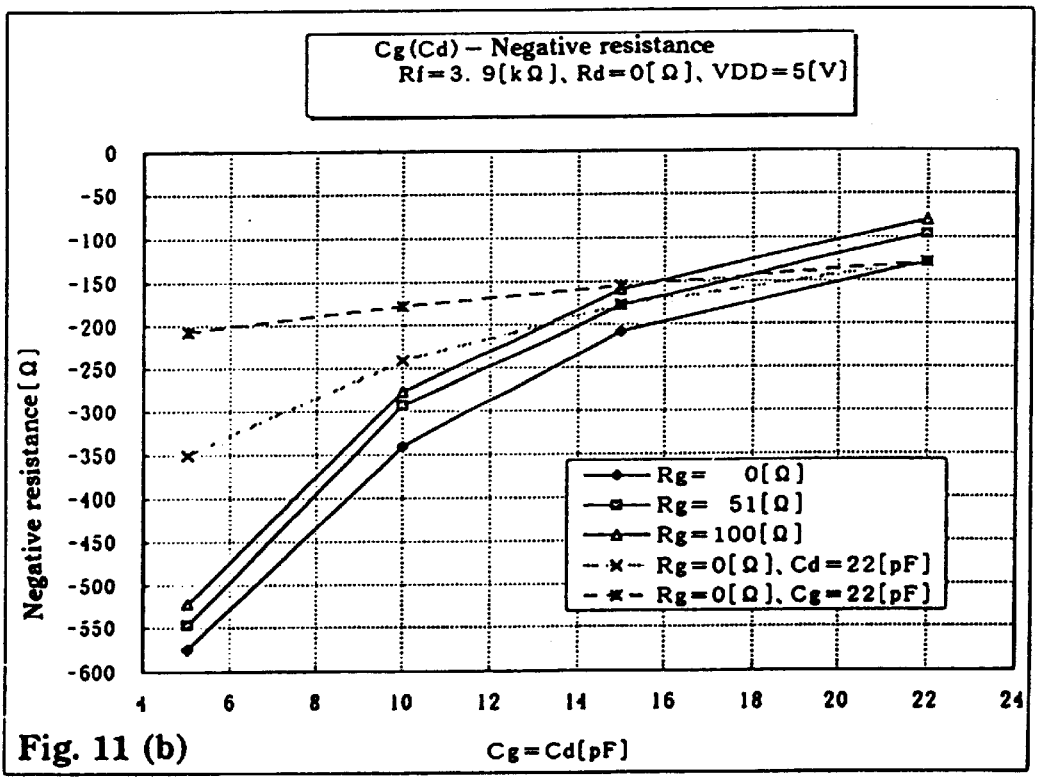

The present invention is not limited to the embodiment described above and the crystal oscillating circuit may be constituted as shown by FIG. 7, FIG. 8 and FIG. 9. In FIGS. 7, 8 and 9, portions in correspondence with the constituent elements of FIG. 1 are designated by the same notations.

Figure 12:
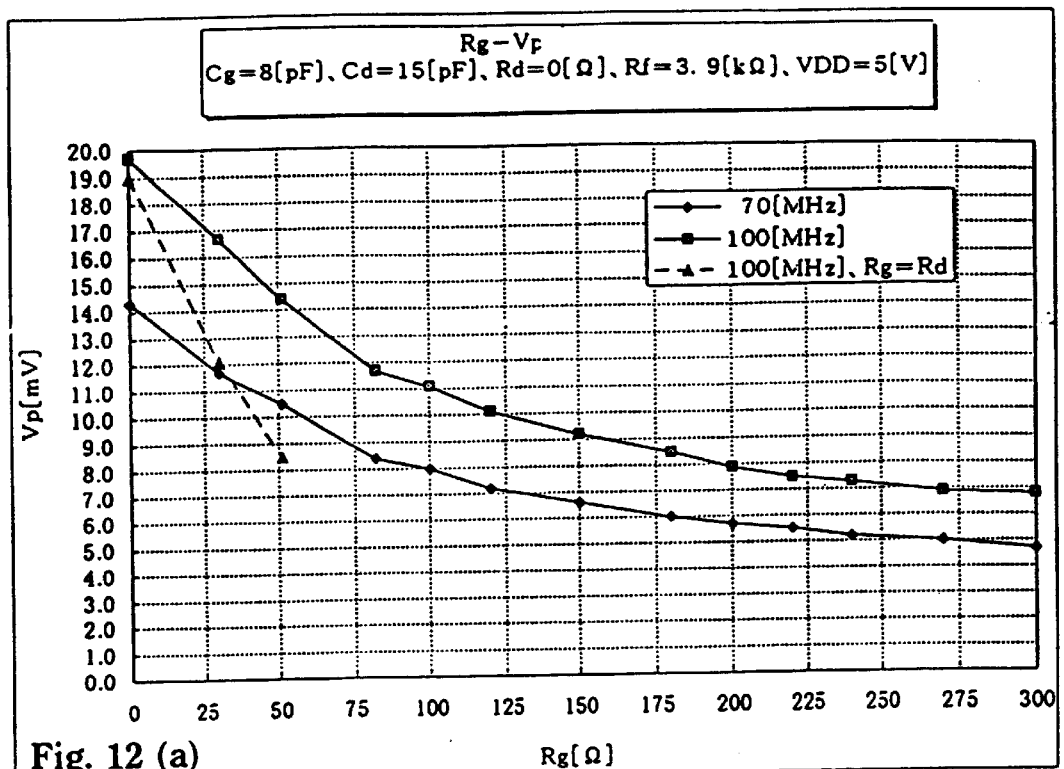
FIGS. 12(a) and 12(b) are graphs showing the characteristics of the crystal oscillating circuit of FIG. 8.
Figure 12:
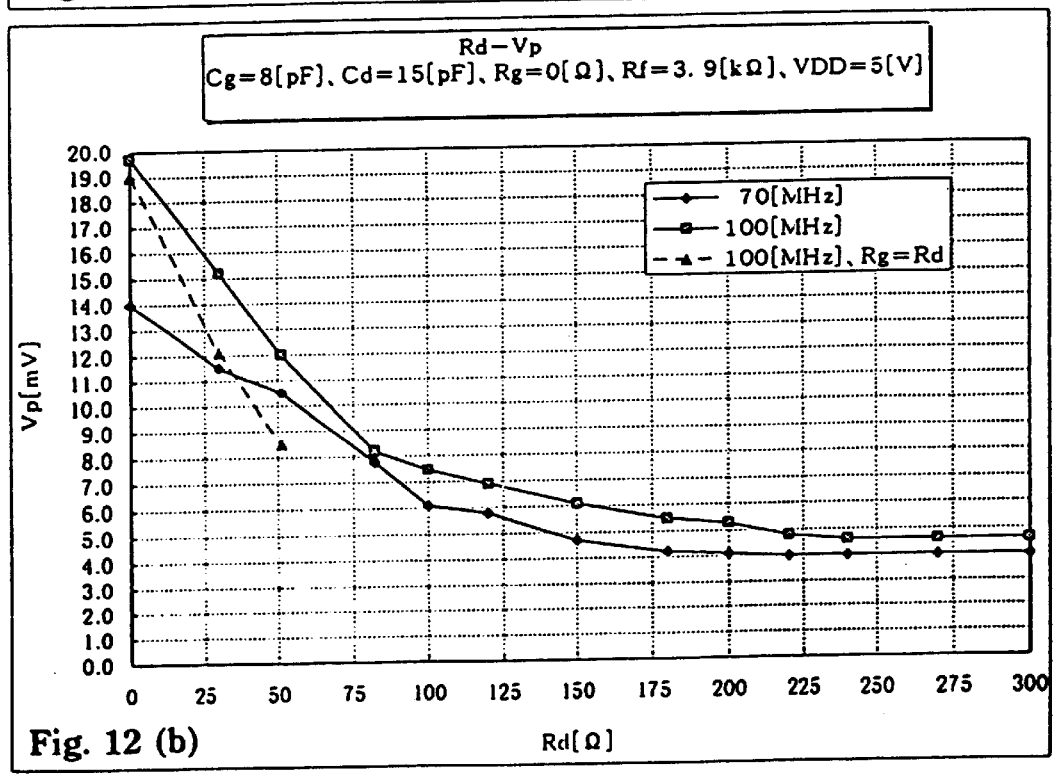
Figure 13:
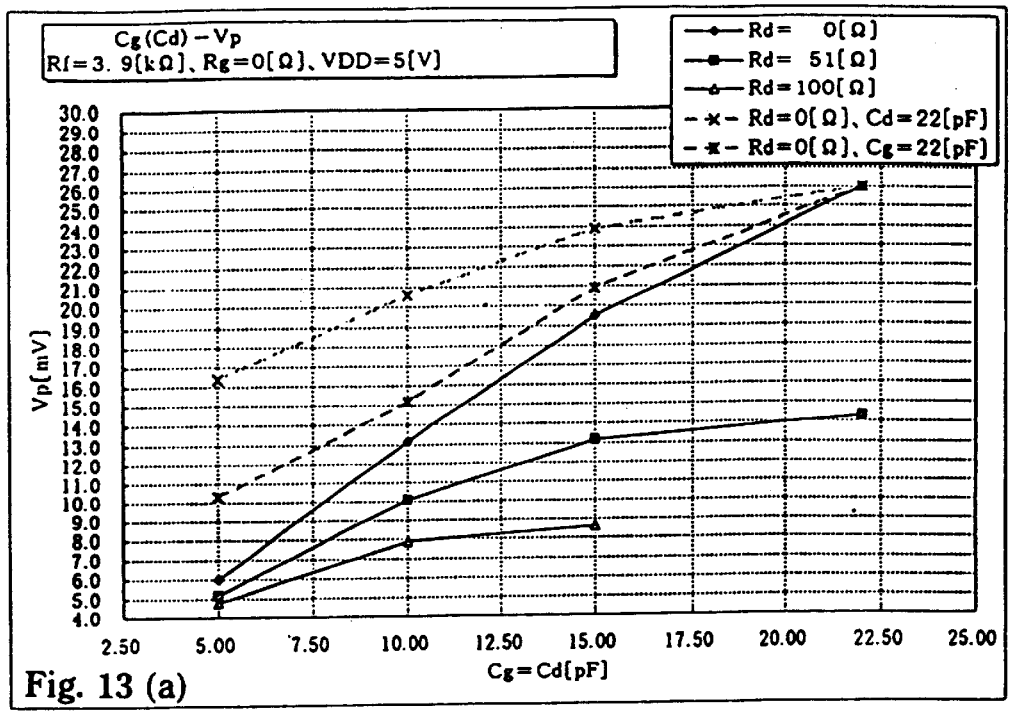
FIGS. 13(a) and 13(b) are graphs showing the characteristics of the crystal oscillating circuit of FIG. 8.
Figure 13:
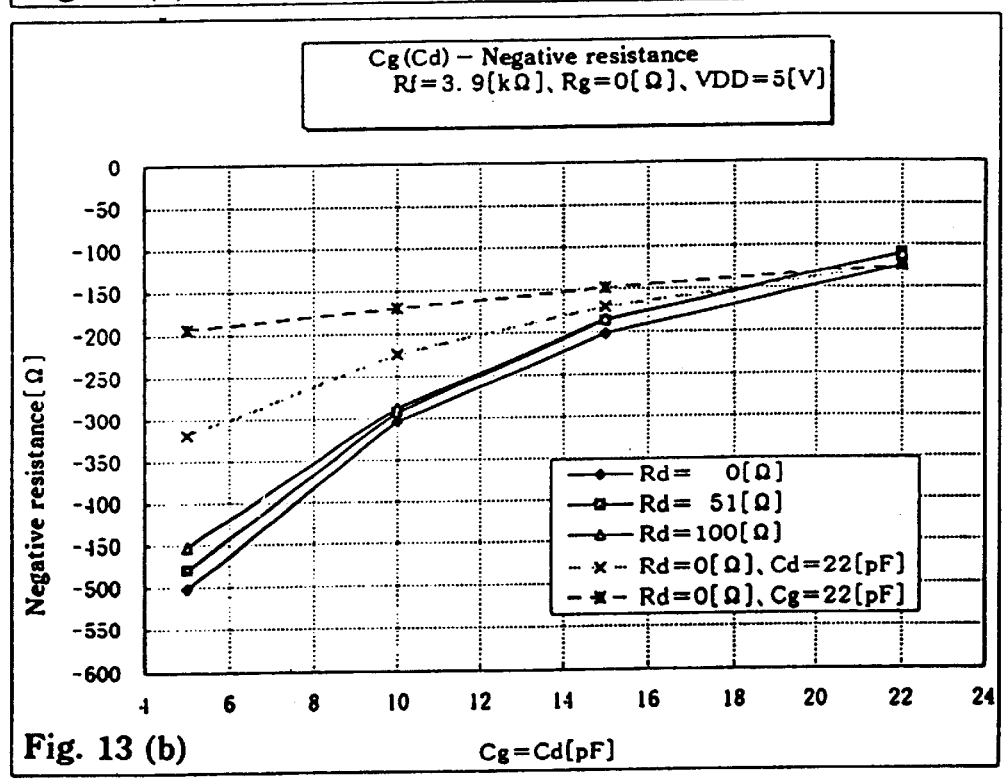
Figure 14:
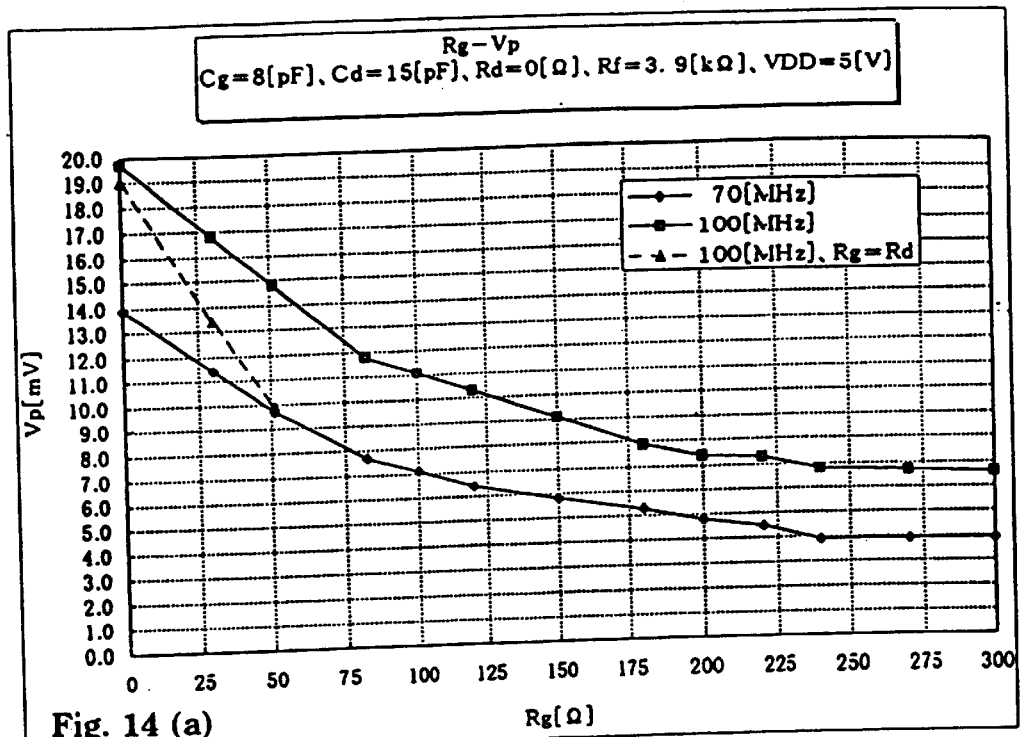
FIGS. 14(a) and 14(b) are graphs showing the characteristics of the crystal oscillating circuit of FIG. 9.
Figure 14:
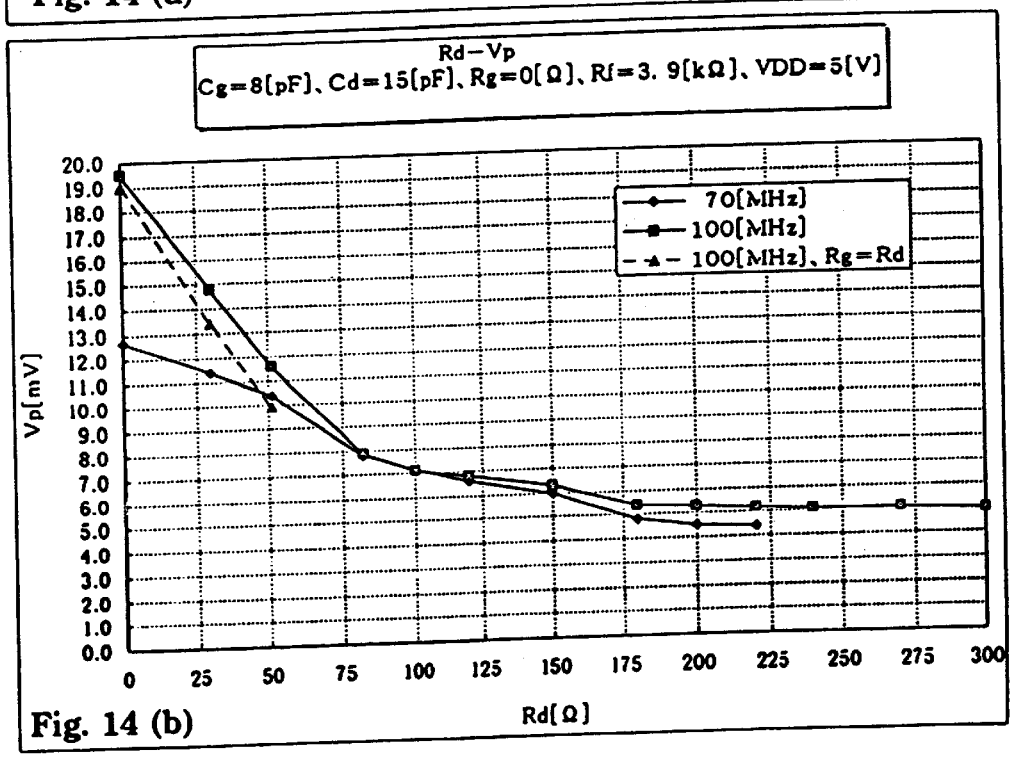
Figure 15:
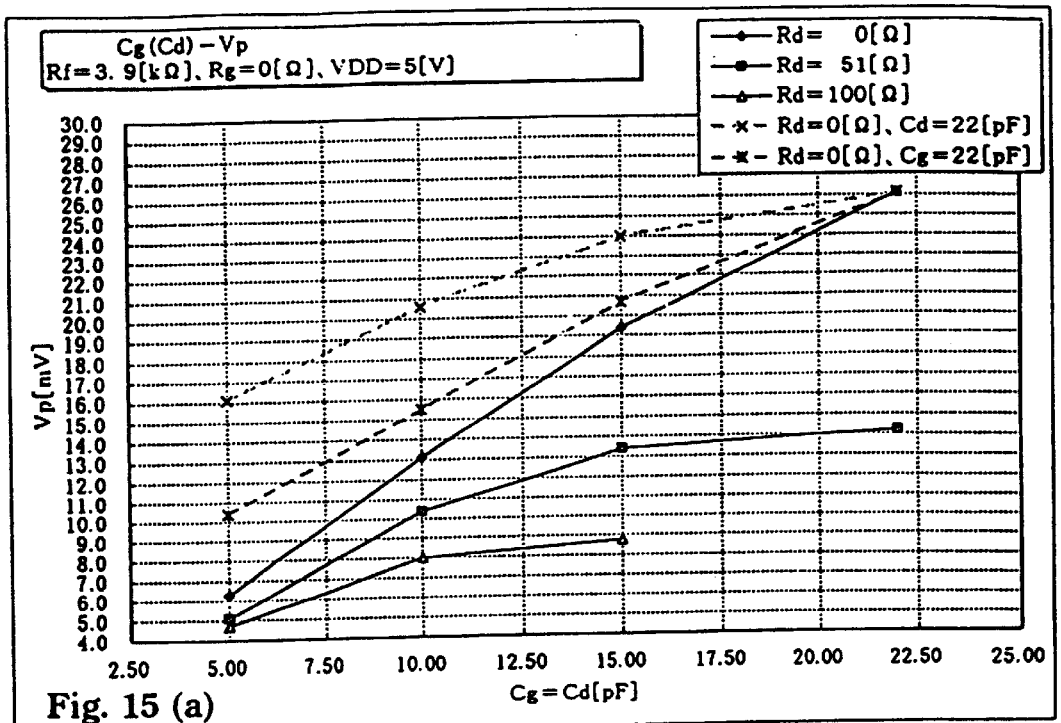
FIGS. 15(a) and 15(b) are graphs showing the characteristics of the crystal oscillating circuit of FIG. 9.
Figure 15:
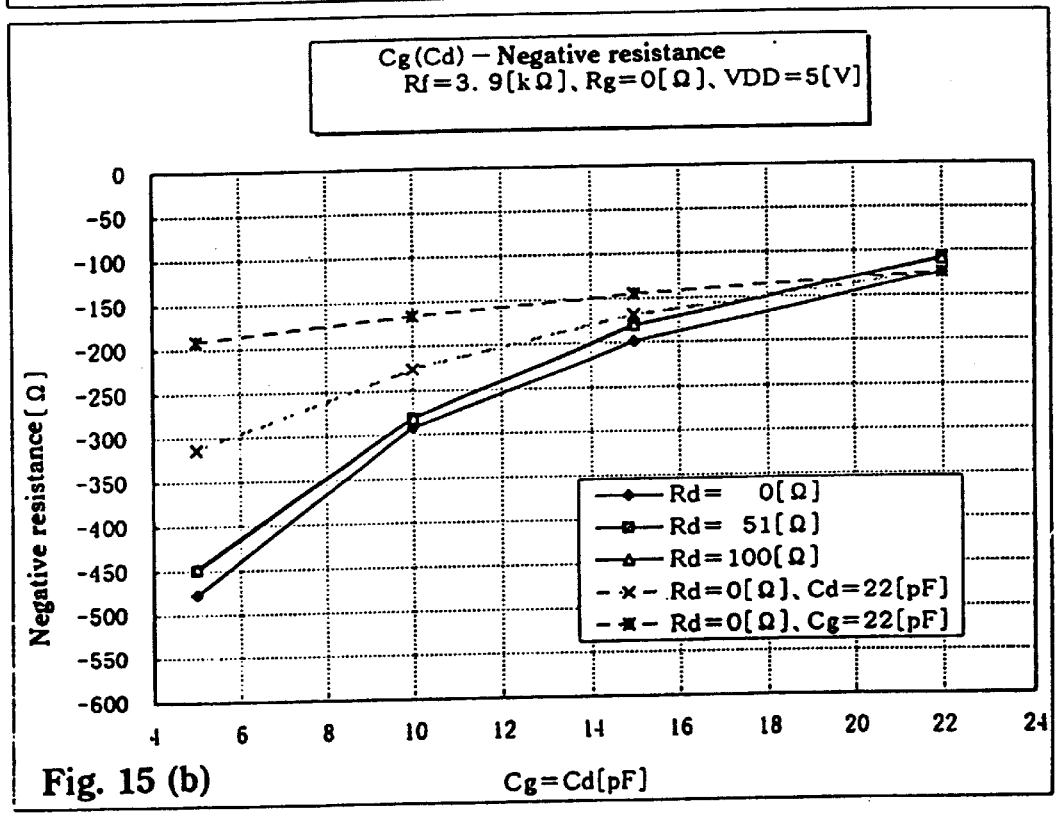
Figure 16:
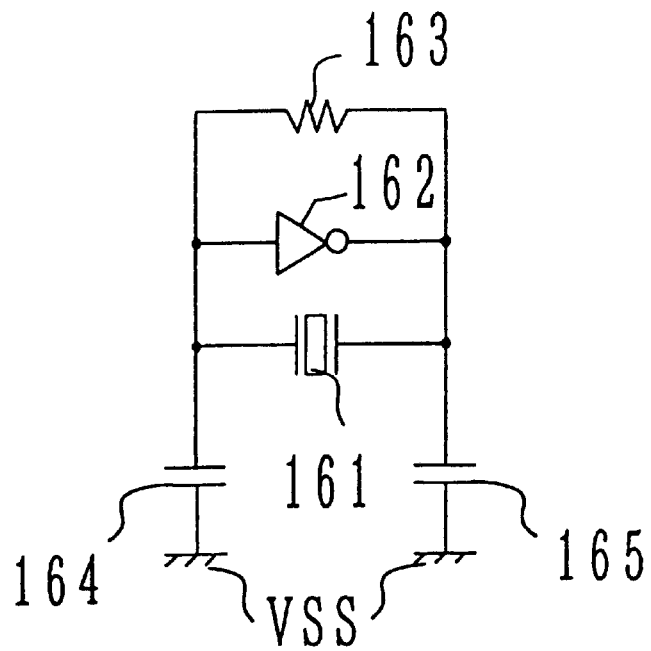
FIG. 16 is a schematic of a conventional crystal oscillating circuit.
Figure 17:
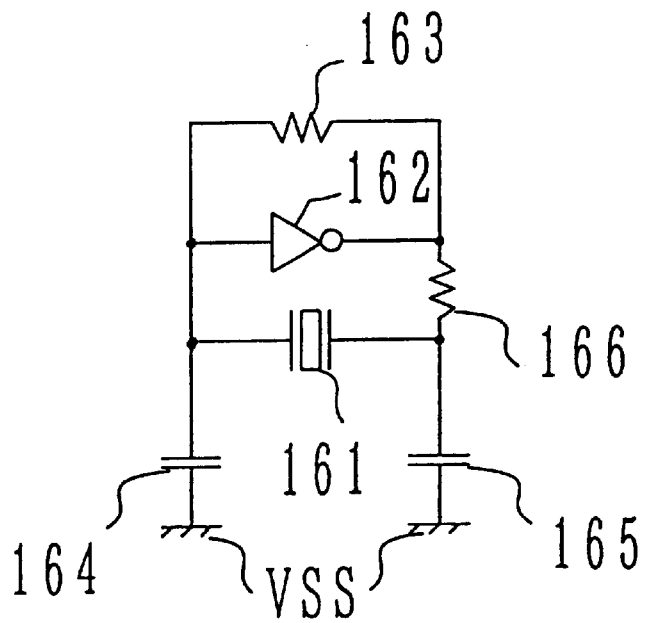
FIG. 17 is a schematic of a conventional crystal oscillating circuit.

As the characteristics of the crystal oscillating circuit of FIG. 1 are represented by FIGS. 4(a) and 4(b) and FIGS. 5(a) and 5(b), correspondingly, the characteristics of the crystal oscillating circuit of FIG. 7 are represented by FIGS. 10(a) and 10(b) and FIGS. 11(a) and 11(b), the characteristics of the crystal oscillating circuit of FIG. 8 are represented by FIGS. 12(a) and 12(b) and FIG. 13 (a) and 13(b), and the characteristics of the crystal oscillating circuit of FIG. 9 are represented by FIGS. 14(a) and 14(b) and FIGS. 15(a) and 15(b). It is known from the relationships shown by these figures that the relationships among the resistors Rg and Rd, the capacitors Cg and Cd, the crystal current and the negative resistance which have been described by using FIGS. 4(a) and 4(b) and FIGS. 5(a) and 5(b), are established substantially similarly also in respect of the crystal oscillating circuits shown by FIG. 7, FIG. 8 and FIG. 9, and it is preferable that the values of the resistors Rg and Rd and the capacitors Cg and Cd of the crystal oscillating circuits of FIG. 7, FIG. 8 and FIG. 9 are set to values substantially similar to those of FIG. 7.

Further, when the characteristics of the crystal oscillating circuits of FIG. 1, FIG. 7, FIG. 8 and FIG. 9 are compared, it is found that the circuit where the resistors Rg and Rd are respectively provided between the capacitor Cg and the power source terminal VDD, between the capacitor Cd and the power source element VDD, the value of the negative resistance is increased and the starting performance of oscillation is excellent.

In each of the crystal oscillating circuits described above, the feedback resistor Rf, the resistors Rg and Rd and the capacitors Cg and Cd may be integrated with the CMOS invertor 2. In that case, it is preferable to use thin film resistors and thin film capacitors for the resistors Rg and Rd and the capacitors Cg and Cd in view of accuracy. However, the present invention is not limited thereto and the resistors Rg and Rd and the capacitors Cg and Cd may be externally attached thereto. At any rate, by using pure resistors and pure capacitors for the resistors Rg and Rd and the capacitors Cg and Cd, values of these can be matched accurately and can be set to optimum resistance values or capacitance values in accordance with required oscillation frequency, size or shape of a crystal resonator or other various factors. Therefore, in integrating the capacitors Cg and Cd, a metal such as Mo, Al or the like is preferably used as an electrode material.

That is, when an electrode of Poly-Si or the like is used as the electrode material, a resistance component is included in the capacitor and the resistance component is connected in series to the resistor Rg or Rd. It is difficult to accurately set the resistance value of the resistance component and therefore, the optimum resistors Rg ant Rd cannot be set. Particularly, when the CMOS invertor having an Mo gate with low resistance value is used, by forming capacitors Cg and Cd by inserting insulators with high dielectric constant between Mo electrodes formed by the same material and the same steps as in the Mo gate, and Al wirings, the capacitors Cg and Cd having almost no resistance components can be provided by which the resistors Rg and Rd can be set accurately. Also in this case, the capacitors that are still more similar to a pure capacitor than capacitors in case of using Poly-Si or the like for the gate electrode, are provided.

Further, although the respective embodiments described that the crystal resonators are oscillated at fundamental frequencies, the present invention can be used also in respect of a circuit where a crystal resonator is oscillated at overtone whereby similar effect is achieved. According to the present invention, the setting of the resistors Rg and Rd does not effect a significant influence on a variation in the negative resistance. Accordingly, with respect to a crystal oscillating circuit for overtone oscillation where the setting of the negative resistance is severe, both promotion of stability of oscillation and reduction of crystal current are more facilitated than in the conventional example since the balance between the setting of resistance value for reducing current flowing in a crystal resonator and the setting for the negative resistance value becomes moderate.

Further, although in the above-described respective embodiments, the power source terminal VDD (5 V) has been used, the present invention is not limited thereto and a similar effect is achieved by a similar operation even when the power source terminal VSS (0 V) is used.

As described above, according to the present invention, current flowing in a crystal resonator can be reduced while maintaining stable oscillation. Accordingly, particularly, when a crystal resonator is downsized and thinned to meet demands of high frequency formation and downsizing, destruction of the crystal resonator caused by excessively large current can be prevented.

Further, by using Molybdenum or Aluminum as a gate electrode material of a CMOS invertor, forming one electrode of a capacitor by the same material and the same steps as in the gate electrode and forming another electrode by a metal wiring material of aluminum or the like, the capacitor can be constituted by a pure capacitance having almost no resistance component. That is, the capacitors and the resistors connected to the CMOS invertor are respectively constituted by pure capacitors and pure resistors and values of these can be set independently from each other and therefore, a crystal oscillating circuit having high accuracy can easily be fabricated.

What is claimed is:

1. A crystal oscillator circuit for producing oscillations at an overtone frequency comprising:

a CMOS invertor having an input terminal and an output terminal;

a crystal resonator, configured for overtone oscillation at the overtone frequency, connected between the input terminal and the output terminal respectively at a first connection node and a second connection node;

a feedback resistor connected between the input terminal and the output terminal of the CMOS invertor;

a first capacitor provided between the first connection node and a power source terminal at a predetermined potential;

a second capacitor provided between the second connection node and a power source terminal at the predetermined potential; and at least one fixed resistor disposed in series with at least one of the first capacitor and the second capacitor and having a resistance limiting a crystal current in the crystal resonator and maintaining negative circuit resistance for stable oscillation at the overtone frequency of the crystal resonator.

2. The crystal oscillator circuit according to claim 1, wherein the at least one fixed resistor includes a first fixed resistor provided between the first connection node and the first capacitor and a second fixed resistor between the second connection node and the second capacitor.

3. The crystal oscillator circuit according to claim 1, wherein the at least one fixed resistor includes a first fixed resistor provided between the first capacitor and the power source terminal and a second fixed resistor provided between the second capacitor and the power source terminal.

4. The crystal oscillator circuit according to claim 1, wherein the at least one fixed resistor includes a first fixed resistor provided between the first capacitor and the power source terminal and a second fixed resistor provided between the second connection node and the second capacitor.

5. The crystal oscillator circuit according to claim 1, wherein the at least one fixed resistor includes a first fixed resistor provided between the first connection node and the first capacitor and a second fixed resistor provided between the second capacitor and the power source terminal.

6. An integrated circuit device for use with a crystal resonator to produce crystal oscillation at an overtone frequency of the crystal resonator, the integrated circuit device comprising:

a CMOS invertor having an input and an output;

terminals for connecting the crystal resonator between the input of the CMOS invertor at a first connection node and the output of the CMOS invertor at a second connection node;

a feedback resistor connected between the input and the output of the CMOS invertor;

a first capacitor connected between the first connection node and a power source terminal at a predetermined potential;

a second capacitor connected between the second connection node and the power source terminal at the predetermined potential; and at least one fixed resistor disposed in series with at least one of the first capacitor and the second capacitor and having a resistance limiting a crystal current in the crystal resonator and maintaining negative circuit resistance for stable oscillation at the overtone frequency of the crystal resonator.

7. The integrated circuit device according to claim 6, wherein the at least one fixed resistor includes a first fixed resistor provided between the first connection node and the first capacitor and a second fixed resistor between the second connection node and the second capacitor.

8. The integrated circuit device according to claim 6, wherein the at least one fixed resistor includes a first fixed resistor provided between the first capacitor and the power source terminal and a second fixed resistor provided between the second capacitor and the power source terminal.

9. The integrated circuit device according to claim 6, wherein the at least one fixed resistor includes a first fixed resistor provided between the first capacitor and the power source terminal and a second fixed resistor provided between the second connection node and the second capacitor.

10. The integrated circuit device according to claim 6, wherein the at least one fixed resistor includes a first fixed resistor provided between the first connection node and the first capacitor and a second fixed resistor provided between the second capacitor and the power source terminal.

11. The integrated circuit device according to claim 6, wherein:

the CMOS invertor has a gate electrode formed of a material which is one of molybdenum and aluminum;

each of the first and the second capacitors has a first electrode formed of the material of the gate electrode and which is formed simultaneously along with the gate electrode; and each of the first and second capacitors has a second electrode formed of a metal wiring material.

12. An integrated circuit device for producing oscillations at an overtone frequency of a crystal resonator comprising:

a CMOS invertor having an input and an output;

terminals for connecting the crystal resonator between the input of the CMOS invertor at a first connection node and the output of the CMOS invertor at a second connection node;

a feedback resistor connected between the input and the output of the CMOS invertor;

terminals for connecting a first capacitor between the first connection node and a power source terminal at a predetermined potential;

terminals for connecting a second capacitor between the second connection node and the power source terminal at the predetermined potential; and at least one fixed resistor connected to at least one of the first connection node and the second connection node to respectively effect a serial connection with at least one of the first capacitor and the second capacitor and said at least one fixed resistor having a resistance level limiting a crystal current in the crystal resonator while maintaining negative circuit resistance for stable oscillation at the overtone frequency of the crystal resonator.

13. The integrated circuit device according to claim 12, wherein the at least one fixed resistor includes a first fixed resistor provided between the first connection node and the first capacitor and a second fixed resistor between the second connection node and the second capacitor.

14. The integrated circuit device according to claim 12, wherein the at least one fixed resistor includes a first fixed resistor provided between the first capacitor and the power source terminal and a second fixed resistor provided between the second capacitor and the power source terminal.

15. The integrated circuit device according to claim 12, wherein the at least one fixed resistor includes a first fixed resistor provided between the first capacitor and the power source terminal and a second fixed resistor provided between the second connection node and the second capacitor.

16. The integrated circuit device according to claim 12, wherein the at least one fixed resistor includes a first fixed resistor provided between the first connection node and the first capacitor and a second fixed resistor provided between the second capacitor and the power source terminal.

17. A crystal oscillator circuit for producing oscillations at an overtone frequency, comprising:

a CMOS invertor having an input terminal and an output terminal;

a crystal resonator configured for overtone oscillation at the overtone frequency and connected between the input terminal and the output terminal respectively at a first connection node and a second connection node;

a feedback resistor connected between the input terminal and the output terminal of the CMOS invertor;

a first capacitor provided between the first connection node and a power source terminal at a predetermined potential;

a second capacitor provided between the second connection node and a power source terminal at the predetermined potential; and one of the first capacitor and the second capacitor having a fixed resistor in series therewith limiting a crystal current in the crystal resonator while maintaining negative circuit resistance for stable oscillation at the overtone frequency of the crystal resonator, said one of the first capacitor and the second capacitor and the fixed series resistor not having a shunting capacitor shunting said one of the first capacitor and the second capacitor and the fixed series resistor.

18. A crystal oscillator circuit according to claim 17, further comprising another one of the first capacitor and the second capacitor having a fixed resistor in series therewith limiting the crystal current in the crystal resonator while maintaining negative circuit resistance for stable oscillation at the overtone frequency of the crystal resonator, said another one of the first capacitor and the second capacitor and the fixed series resistor not having a shunting capacitor shunting said another one of the first capacitor and the second capacitor and the fixed series resistor.

19. An integrated circuit device for use with a crystal resonator to produce crystal oscillation at an overtone frequency of the crystal resonator, the integrated circuit device comprising:

a CMOS invertor having an input and an output;

terminals for connecting the crystal resonator between the input of the CMOS invertor at a first connection node and the output of the CMOS invertor at a second connection node;

a feedback resistor connected between the input and the output of the CMOS invertor;

a first capacitor connected between the first connection node and a power source terminal at a predetermined potential;

a second capacitor connected between the second connection node and the power source terminal at the predetermined potential; and one of the first capacitor and the second capacitor having a fixed resistor in series therewith limiting a crystal current in the crystal resonator while maintaining negative circuit resistance for stable oscillation at the overtone frequency of the crystal resonator, said one of the first capacitor and the second capacitor and the fixed series resistor not having a shunting capacitor shunting said one of the first capacitor and the second capacitor and the fixed series resistor.

20. The integrated circuit device according to claim 19, further comprising another one of the first capacitor and the second capacitor having a fixed resistor in series therewith limiting the crystal current in the crystal resonator while maintaining negative circuit resistance for stable oscillation at the overtone frequency of the crystal resonator, said another one of the first capacitor and the second capacitor and the fixed series resistor not having a shunting capacitor shunting said another one of the first capacitor and the second capacitor and the fixed series resistor.

21. An integrated circuit device for crystal oscillation at an overtone frequency of a crystal resonator, comprising:

a CMOS invertor having an input and an output;

terminals for connecting the crystal resonator between the input of the CMOS invertor at a first connection node and the output of the CMOS invertor at a second connection node;

a feedback resistor connected between the input and the output of the CMOS invertor;

terminals for connecting a first capacitor between the first connection node and a power source terminal at a predetermined potential;

terminals for connecting a second capacitor between the second connection node and the power source terminal at the predetermined potential; and one of the first connection node and the second connection node having a fixed resistor connected to the power source terminal to respectively effect a serial connection with one of said first capacitor and said second capacitor, the fixed resistor having a resistance limiting a crystal current in the crystal resonator while maintaining negative circuit resistance for stable oscillation at the overtone frequency of the crystal resonator, said one of the first connection node and the second connection node not having a shunting capacitor shunting said one of the first connection node and the second connection node to the power source terminal.

22. The integrated circuit device according to claim 21, further comprising another one of the first connection node and the second connection node having a fixed resistor connected to the power source terminal to respectively effect a serial connection with one of said first capacitor and said second capacitor, the fixed resistor having a resistance limiting a crystal current in the crystal resonator while maintaining negative circuit resistance for stable oscillation at the overtone frequency of the crystal resonator, said another one of the first connection node and the second connection node not having a shunting capacitor shunting said one of the first connection node and the second connection node to the power source terminal.

* * * * *